(12) United States Patent
Chiu et al.

(10) Patent No.: US 9,984,981 B2
(45) Date of Patent: May 29, 2018

(54) PACKAGES WITH INTERPOSERS AND METHODS FOR FORMING THE SAME

(71) Applicant: Taiwan Semiconductor Manufacturing Company, Ltd., Hsinchu (TW)

(72) Inventors: Sao-Ling Chiu, Hsinchu (TW); Kuo-Ching Hsu, Chung-Ho (TW); Wei-Cheng Wu, Hsinchu (TW); Ping-Kang Huang, Chiayi (TW); Shang-Yun Hou, Jubei (TW); Shin-Puu Jeng, Hsinchu (TW); Chen-Hua Yu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 15/494,947

(22) Filed: Apr. 24, 2017

(65) Prior Publication Data

US 2017/0229401 A1 Aug. 10, 2017

Related U.S. Application Data

(63) Continuation of application No. 13/968,730, filed on Aug. 16, 2013, now Pat. No. 9,633,869.

(51) Int. Cl.
*H01L 21/56* (2006.01)
*H01L 21/78* (2006.01)
(Continued)

(52) U.S. Cl.
CPC .......... *H01L 23/562* (2013.01); *H01L 21/486* (2013.01); *H01L 21/4853* (2013.01); *H01L 21/4857* (2013.01); *H01L 21/563* (2013.01);
*H01L 21/565* (2013.01); *H01L 21/78* (2013.01); *H01L 23/3135* (2013.01); *H01L 23/49816* (2013.01); *H01L 23/49822* (2013.01);
(Continued)

(58) Field of Classification Search
CPC ..... H01L 21/78; H01L 21/565; H01L 21/563; H01L 23/3135
See application file for complete search history.

(56) References Cited

U.S. PATENT DOCUMENTS 7,217,999 B1   5/2007  Honda
7,670,866 B2   3/2010  Sun et al.
(Continued)

FOREIGN PATENT DOCUMENTS

CN    1304174 A    7/2001
CN    101188215 A    5/2008
(Continued)

*Primary Examiner* — Jarrett Stark
*Assistant Examiner* — Charles N Ausar-El
(74) *Attorney, Agent, or Firm* — Slater Matsil, LLP (57) ABSTRACT

A package structure includes an interposer, a die over and bonded to the interposer, and a Printed Circuit Board (PCB) underlying and bonded to the interposer. The interposer is free from transistors therein (add transistor), and includes a semiconductor substrate, an interconnect structure over the semiconductor substrate, through-vias in the silicon substrate, and redistribution lines on a backside of the silicon substrate. The interconnect structure and the redistribution lines are electrically coupled through the through-vias.

20 Claims, 10 Drawing Sheets

(51) Int. Cl.
  *H01L 23/31*    (2006.01)
  *H01L 23/00*    (2006.01)
  *H01L 21/48*    (2006.01)
  *H01L 23/498*   (2006.01)

(52) U.S. Cl.
  CPC .. *H01L 23/49827* (2013.01); *H01L 23/49838* (2013.01); *H01L 24/16* (2013.01); *H01L 2224/16225* (2013.01); *H01L 2924/3511* (2013.01)

(56) References Cited

U.S. PATENT DOCUMENTS

| | | | |
|---|---|---|---|
| 8,815,650 B2* | 8/2014 | Pagaila | H01L 21/563 257/686 |
| 8,866,301 B2 | 10/2014 | Lin et al. | |
| 9,240,387 B2* | 1/2016 | Chen | H01L 21/563 |
| 9,633,869 B2* | 4/2017 | Chiu | H01L 24/97 |
| 2002/0085364 A1 | 7/2002 | Downes, Jr. et al. | |
| 2010/0308474 A1 | 12/2010 | Shibuya | |
| 2011/0193221 A1 | 8/2011 | Hu et al. | |
| 2011/0285005 A1* | 11/2011 | Lin | H01L 21/4846 257/686 |
| 2011/0291288 A1* | 12/2011 | Wu | H01L 23/49827 257/774 |
| 2011/0316147 A1 | 12/2011 | Shih et al. | |
| 2012/0305916 A1 | 12/2012 | Liu et al. | |
| 2013/0049182 A1 | 2/2013 | Gong et al. | |
| 2013/0049195 A1 | 2/2013 | Wu et al. | |
| 2013/0062760 A1 | 3/2013 | Hung et al. | |
| 2013/0062761 A1 | 3/2013 | Lin et al. | |
| 2013/0087920 A1* | 4/2013 | Jeng | H01L 23/49827 257/773 |
| 2013/0092935 A1 | 4/2013 | Wang et al. | |
| 2013/0099385 A1 | 4/2013 | Chen et al. | |
| 2013/0119539 A1 | 5/2013 | Hsiao et al. | |
| 2013/0119552 A1* | 5/2013 | Lin | H01L 25/0652 257/774 |
| 2013/0120018 A1 | 5/2013 | Hou et al. | |
| 2013/0134559 A1* | 5/2013 | Lin | H01L 23/49827 257/620 |
| 2013/0175686 A1 | 7/2013 | Meyer et al. | |
| 2013/0175694 A1 | 7/2013 | Shih et al. | |
| 2013/0270682 A1* | 10/2013 | Hu | H01L 23/5389 257/666 |
| 2014/0027926 A1 | 1/2014 | Chen et al. | |
| 2014/0042614 A1 | 2/2014 | Yu et al. | |
| 2014/0042643 A1* | 2/2014 | Yu | H01L 21/486 257/777 |
| 2014/0175665 A1 | 6/2014 | Kang | |
| 2014/0264856 A1 | 9/2014 | Huang et al. | |
| 2014/0264857 A1 | 9/2014 | Wu | |
| 2014/0264858 A1 | 9/2014 | Chen et al. | |
| 2014/0319683 A1 | 10/2014 | Lin et al. | |
| 2015/0130055 A1 | 5/2015 | Lin et al. | |
| 2015/0137365 A1 | 5/2015 | Yoo et al. | |
| 2017/0278827 A1* | 9/2017 | Yu | H01L 24/85 |
| 2017/0287865 A1* | 10/2017 | Yu | H01L 24/16 |

FOREIGN PATENT DOCUMENTS

| | | |
|---|---|---|
| CN | 102969252 A | 3/2013 |
| CN | 103137583 A | 6/2013 |

\* cited by examiner

PACKAGES WITH INTERPOSERS AND METHODS FOR FORMING THE SAME

PRIORITY CLAIM AND CROSS-REFERENCE

This application is a continuation of U.S. patent application Ser. No. 13/968,730, entitled "Packages with Interposers and Methods for Forming the Same," filed on Aug. 16, 2013, which application is incorporated herein by reference.

BACKGROUND

In the packaging of integrated circuits, a plurality of top dies may be bonded on an interposer wafer, which comprises a plurality of interposers therein. After the bonding of the top dies, an underfill is dispensed into the gaps between the top dies and the interposer wafer. A curing process may then be performed to cure the underfill. A molding compound can be applied to mold the top dies therein. The resulting interposer wafer and the top dies thereon are then sawed apart into a plurality of packages, with the packages including exposed electrical connections such as solder balls. The packages are then bonded to printed circuit boards.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 8 are cross-sectional views and top views of intermediate stages in the manufacturing of a package in accordance with some exemplary embodiments.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package including an interposer and the methods of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 1A:
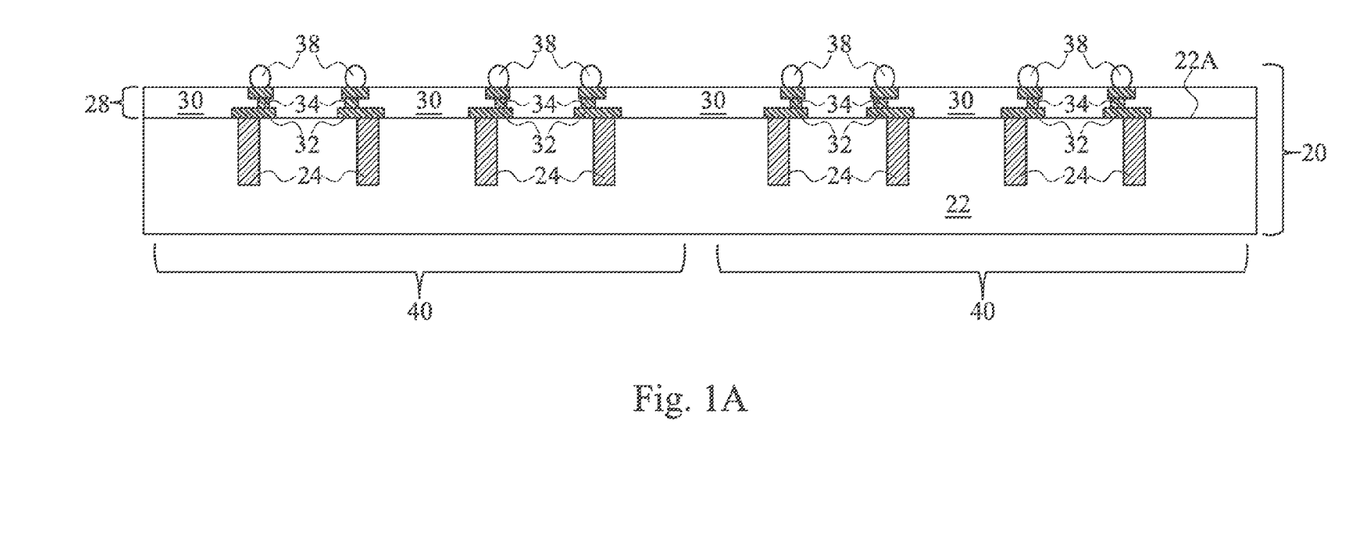

FIG. 1A illustrates a cross-sectional view of package component 20. Package component 20 includes substrate 22. In some embodiments, substrate 22 is a semiconductor substrate, which may further be a crystalline silicon substrate, although it may be formed of other semiconductor materials such as silicon germanium, silicon carbon, or the like. In alternative embodiments, substrate 22 is a dielectric substrate. Package component 20 may be a device wafer, which includes active devices such as transistors (not shown) formed at surface 22A of semiconductor substrate 22. In the embodiments wherein package component 20 is a device wafer, it may also include passive devices (not shown) such as resistors and/or capacitors. In alternative embodiments, package component 20 is an interposer wafer that does not include active devices therein. In these embodiments, package component 20 may, or may not, include passive devices formed therein. Through Vias (TVs) 24 may be formed to extend from top surface 22A of substrate 22 into substrate 22. TVs 24 are also sometimes referred as through-substrate vias or through-silicon vias when substrate 22 is a silicon substrate. Package component 20 includes a plurality of package components 40, which may be identical to each other. Accordingly, package components 40 may be device chips (also known as dies when sawed apart) that include active devices, interposers that are free from active devices, or the like. Package components 40 are alternatively referred to as interposers or dies 40 hereinafter.

Interconnect structure 28 is formed over substrate 22, and is used to electrically connect to the integrated circuit devices (if any) and/or TVs 24. Interconnect structure 28 may include a plurality of dielectric layers 30. Metal lines 32 are formed in dielectric layers 30. Although one layer of metal lines 32 is illustrated, there may be a plurality of layers of metal lines 32. Vias 34 are formed between, and interconnecting, the overlying and underlying metal lines 32. Metal lines 32 and vias 34 are sometimes referred to as Redistribution Lines (RDL) 32/34. In some embodiments, dielectric layers 30 comprise silicon oxide, silicon nitride, silicon carbide, silicon oxynitride, combinations thereof, and/or multi-layers thereof. Alternatively, dielectric layers 30 may comprise one or more low-k dielectric layer having a low k value(s). The k values of the low-k dielectric materials in dielectric layers 30 may be lower than about 3.0, or lower than about 2.5, for example.

Electrical connectors 38 are formed at the top surface of package component 20. In some embodiments, electrical connectors 38 comprise metal pillars (copper pillars, for example), wherein solder caps may be, or may not be, formed on the top surfaces of the metal pillars. In alternative embodiments, electrical connectors 38 comprise solder balls. In yet other embodiments, electrical connectors 38 may be composite metal bumps comprising copper posts, nickel layers, solder caps, Electroless Nickel Immersion Gold (ENIG), Electroless Nickel Electroless Palladium Immersion Gold (ENEPIG), and/or the like.

Figure 1B:
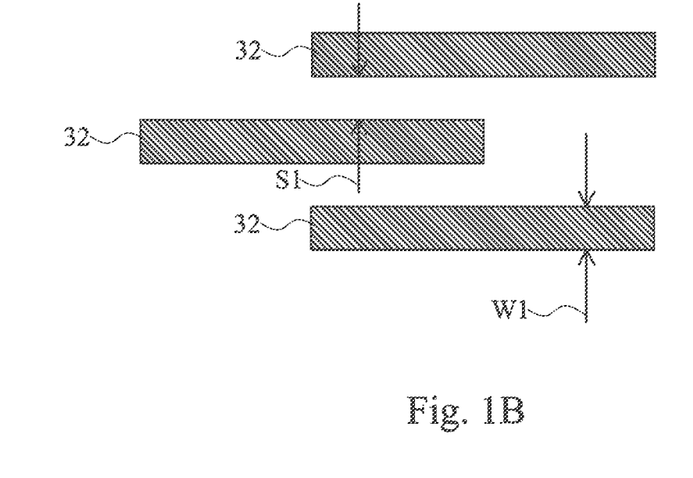

FIG. 1B illustrates a top view of a portion of package component 20, wherein a plurality of metal lines 32 is illustrated. In some embodiments, metal lines 32, vias 34, and dielectric layers 30 are formed using the same technology for forming integrated circuits on device dies. Accordingly, metal lines 32 may have small line widths W1 and small line spacings S1. In some embodiments, line widths W1 are smaller than 1 μm, and may be between about 0.2 μm and about 0.6 μm. Line spacing S1 may also be smaller than 1 μm, and may be between about 0.2 μm and about 0.6 μm. With the small line widths W1 and line spacing S1, the routability of metal lines 32 and vias 34 is improved, and a few layers of metal lines may be enough to satisfy the routing requirements of the resulting packages. Accordingly, when package components 40 (FIG. 1A) are packaged as packages, no package substrate is needed in the final packages to increase the routability.

Figure 2:
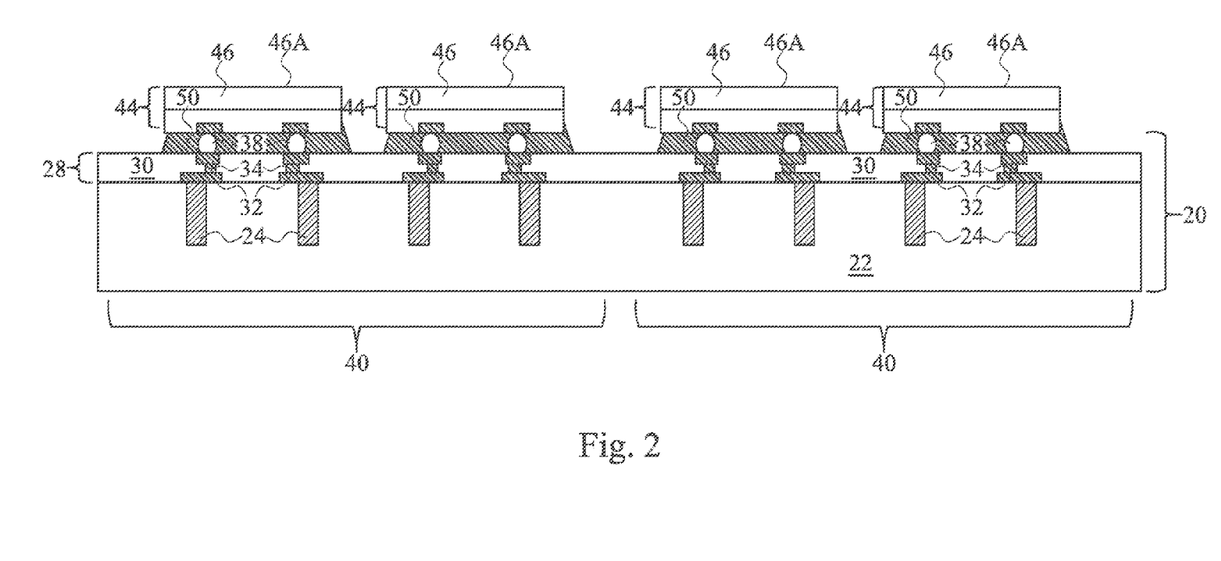

Referring to FIG. 2, package components 44 are bonded to package component 20, for example, through flip-chip bonding. Electrical connectors 38 accordingly bond, and electrically couple, the integrated circuits in package components 44 to RDLs 32 and TVs 24 in package component 20. Package components 44 may be device dies including logic circuits, memory circuits, or the like. Accordingly, package components 44 are alternatively referred to as dies 44 hereinafter. Alternatively, package components 44 may be packages that include dies bonded to the respective interposers, package substrates, and/or the like. On each of dies 40, there may be one, two, or more dies 44 bonded thereon. In some embodiments, dies 44 include substrates 46, which may be silicon substrates in some embodiments. In alternative embodiments, substrates 46 are formed of silicon germanium, silicon carbide, III-V compound semiconductors, or the like. Accordingly, surfaces 46A of substrates 46 are the surfaces of silicon, silicon germanium, silicon carbide, III-V compound semiconductor, or the like.

Next, polymer 50 is dispensed into the gaps between dies 44 and package component 20. Polymer 50 may be an underfill, and hence is referred to as underfill 50 hereinafter, although it may also comprise other polymers such as an epoxy. Underfill 50 may also be a molding underfill, or a non-flow underfill. In these embodiments, underfill 50 and molding material 52 (FIG. 3) may be the same material, and are dispensed in a single dispensing step.

Figure 3:
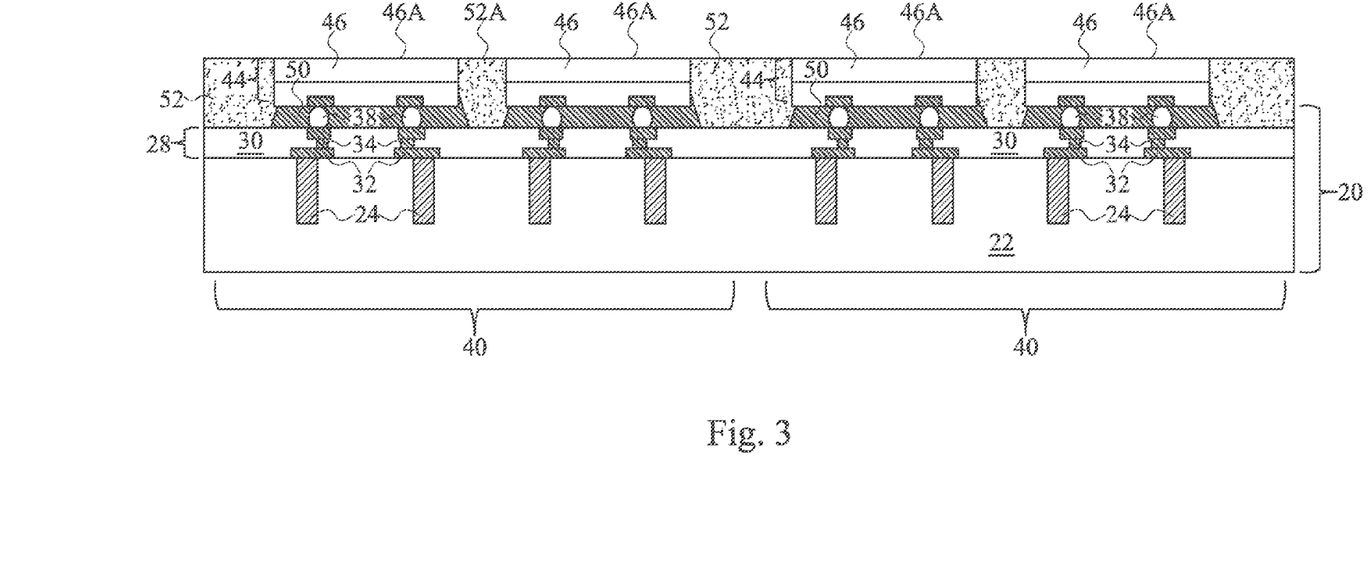

Referring to FIG. 3, molding material 52, which may be a polymer, is molded on dies 44 and package component 20, for example, using compress molding. In some embodiments, molding material 52 comprises a molding compound, an epoxy, or the like. A curing step is performed to cure molding material 52, wherein the curing step may be performed through thermal curing, Ultra-Violet (UV) curing, or the like. In the embodiments dies 44 are buried in molding material 52, after the curing of molding material 52, a planarization step, such as a grinding, may be performed to remove excess portions of molding material 52, which excess portions are over top surfaces 46A of device dies 44. Accordingly, surfaces 46A of substrates 46 are exposed, and are level with top surface 52A of molding material 52. In alternative embodiments, after the CMP, the top surface of molding material 52 is higher than top surfaces 46A of substrates 46.

Figure 4:
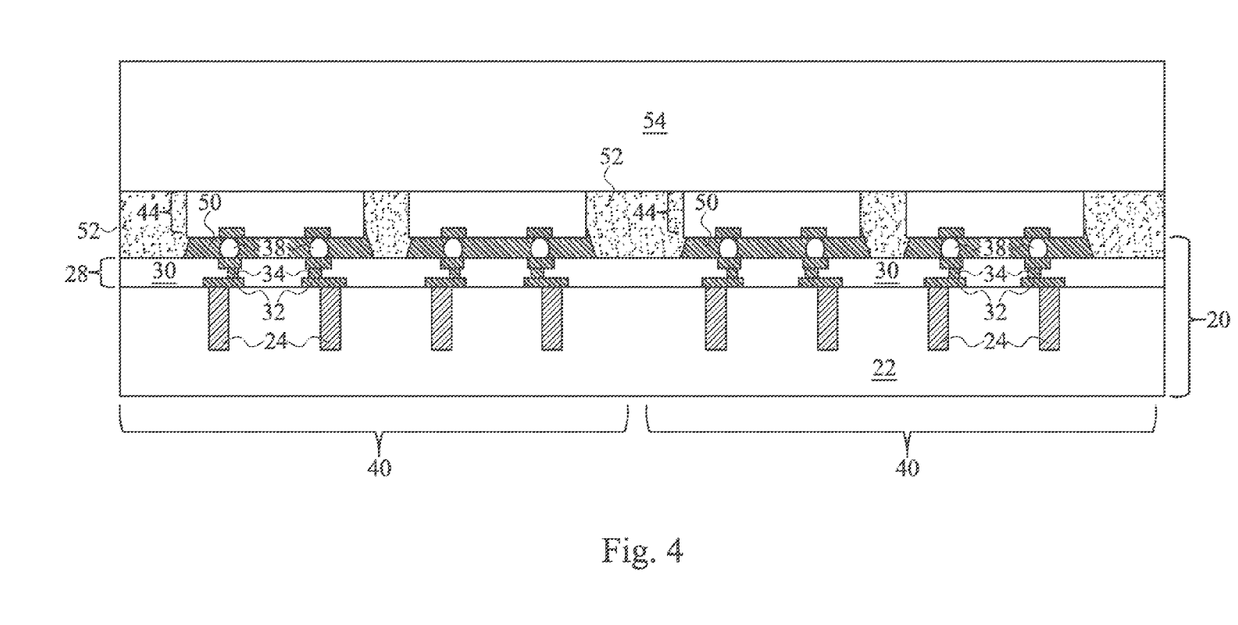
Figure 5:
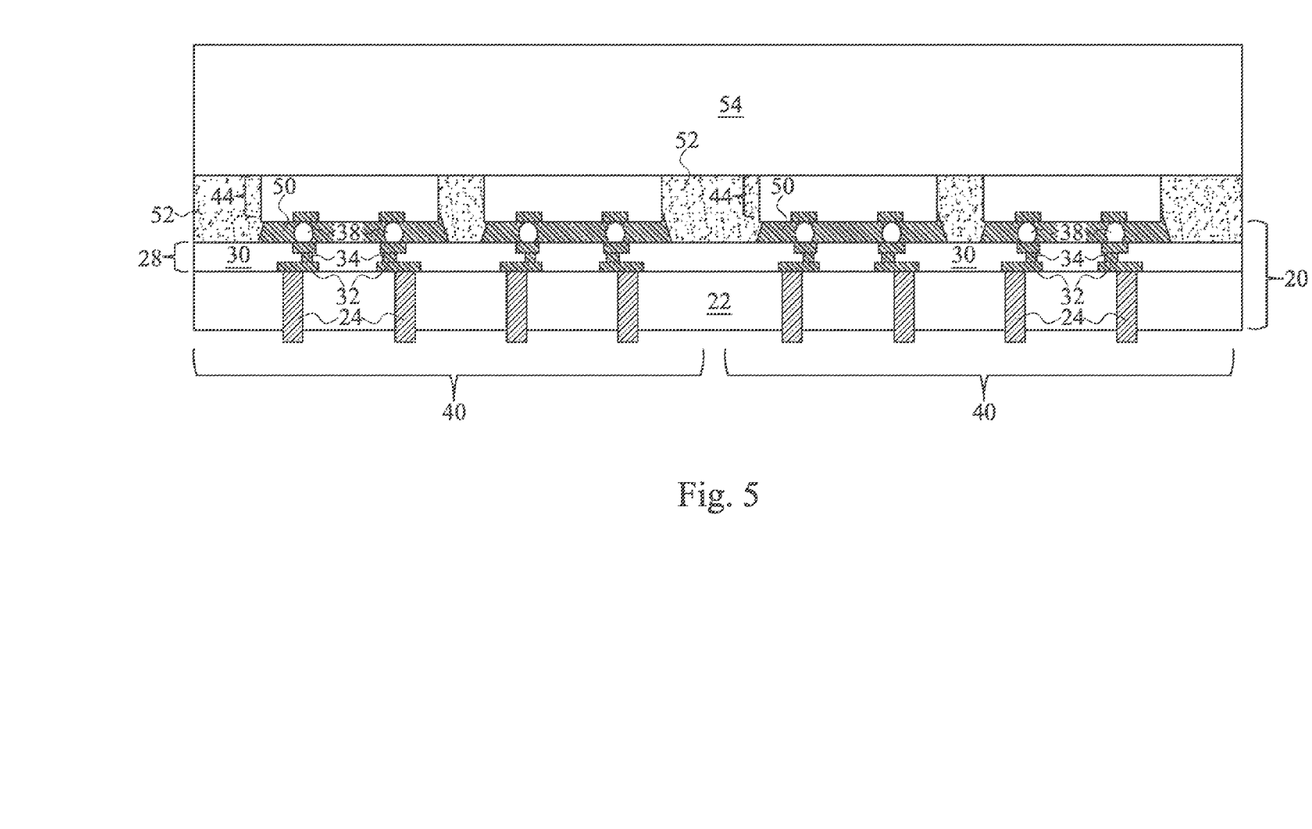

Referring to FIG. 4, carrier 54 is attached to the front side of the structure in FIG. 3, for example, through an adhesive (not shown). In some embodiments, carrier 54 is a glass carrier. In alternative embodiments, carrier 54 is a silicon carrier, an organic carrier, or the like. Next, as shown in FIGS. 5 through 6B, a backside process is performed. Referring to FIG. 5, a backside grinding is performed on the backside of semiconductor substrate 22 to thin semiconductor substrate 22, until TVs 24 are exposed. An etch step may be performed to etch a thin layer of semiconductor substrate 22 from the backside, so that TVs 24 protrude out of the backside of substrate 22.

Figure 6A:
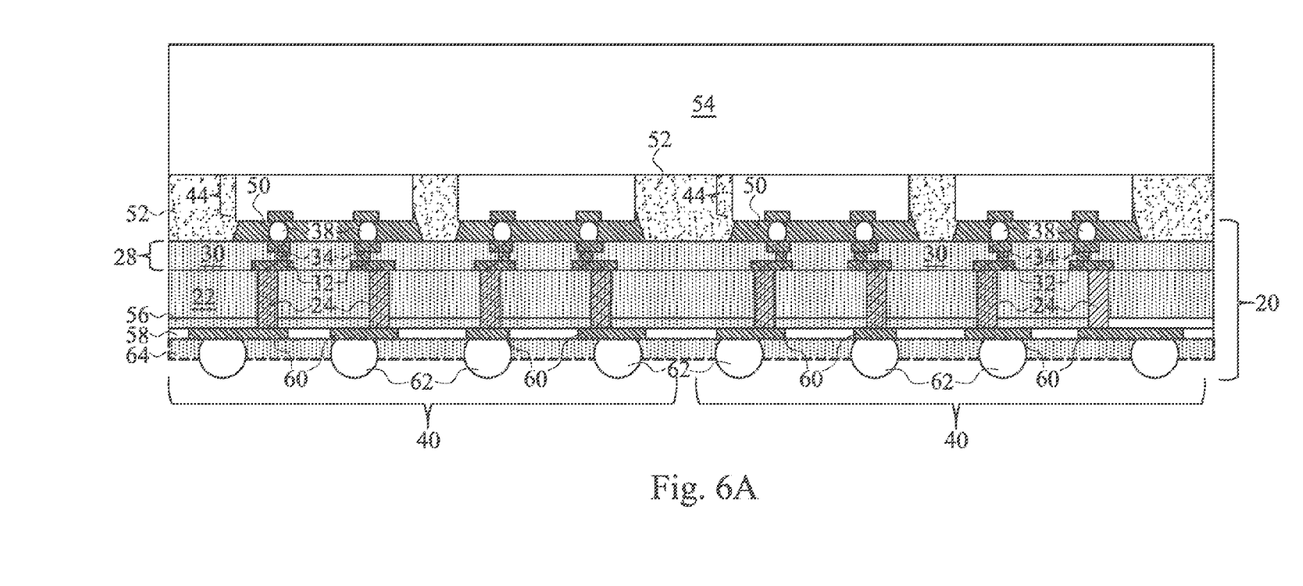
Figure 6B:
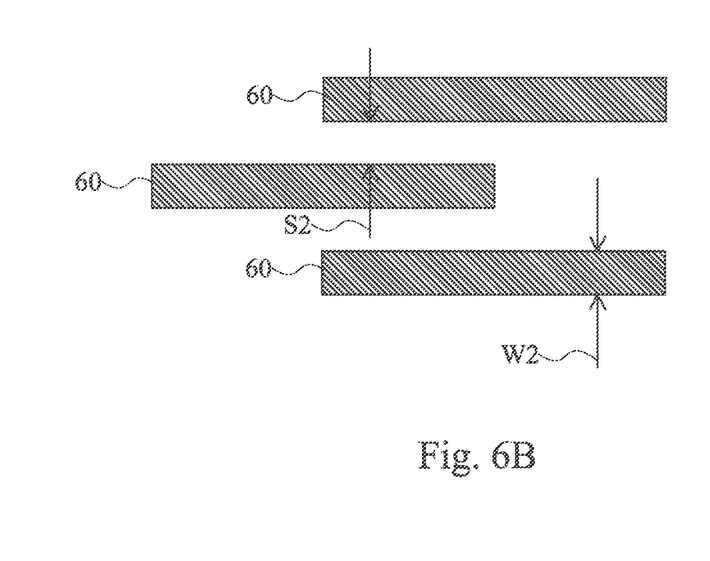

As shown in FIG. 6A, dielectric layer 56 is formed on the backside of semiconductor substrate 22, followed by a light CMP, so that TVs 24 protrude out of dielectric layer 56. Dielectric layer 56 may comprise silicon oxide, silicon oxynitride, silicon nitride, or combinations thereof. In some embodiments, one or more dielectric layer 58 is formed on the backside of package component 20, with Redistribution Lines (RDLs) 60 formed therein. RDLs 60 are electrically coupled to TVs 24. In some embodiments, dielectric layers 58 comprise passivation layers, which may be formed of silicon oxide, silicon nitride, silicon oxynitride, or the like. In alternative embodiments, dielectric layers 58 include polymers such as polyimide. RDLs 60 may be formed of copper in some embodiments. Furthermore, a nickel layer may be, or may not be, formed on the copper. For example, when the line thickness of RDLs 60 is smaller than about 7 μm, a nickel layer is formed on the (illustrated bottom) surface of RDLs 60. Each of RDLs 60 may also be a composite layer, including, for example, a copper layer and a nickel layer over the copper layer. In these embodiments, the top layer of the composite layer comprises nickel when the underlying copper layer has a thickness smaller than about 7 μm.

Electrical connectors 62 are also formed on the backside of package component 20 and electrically coupled to TVs 24. In some embodiments, electrical connectors 62 are solder balls. In other embodiments, electrical connectors 62 comprise metal pads, metal bumps, solder caps, or the like. The pitches of electrical connectors 62 may be greater than about 400 μm. Electrical connectors 62 may be used to bond to an additional electrical component (not shown), which may be a semiconductor substrate, a package substrate, a printed circuit board (PCB), or the like.

In some embodiments, molding compound 64, which is sometimes referred to as liquid molding compound 64, is applied. Accordingly, each of connectors 62 may include a first portion embedded in molding compound 64, and a second portion not embedded in molding compound 64. For example, the thickness of molding compound 64 may be between about 30 percent and about 70 percent the height of solder balls 62. Since molding compound 64 and molding material 52 are on the opposite sides of package component 20, molding compound 64 may compensate for the stress applied by molding material 52, so that the warpage of the resulting package is reduced. In alternative embodiments, no molding compound 64 is applied.

FIG. 6B illustrates a view of a portion of package component 20 from the back side, wherein a plurality of RDLs 60 is illustrated. In some embodiments, RDLs 60 and dielectric layers 58 are formed using the same technology that is used to form interconnect structures on device dies. Accordingly, RDLs 60 may have small line widths W2 and small line spacings S2. In some embodiments, line widths W2 are greater than 1 μm, and may be in the range between about 2 μm and about 50 μm. Line spacing S2 may also be greater than 1 μm, and may be between about 2 μm and about 10 μm.

Figure 7:
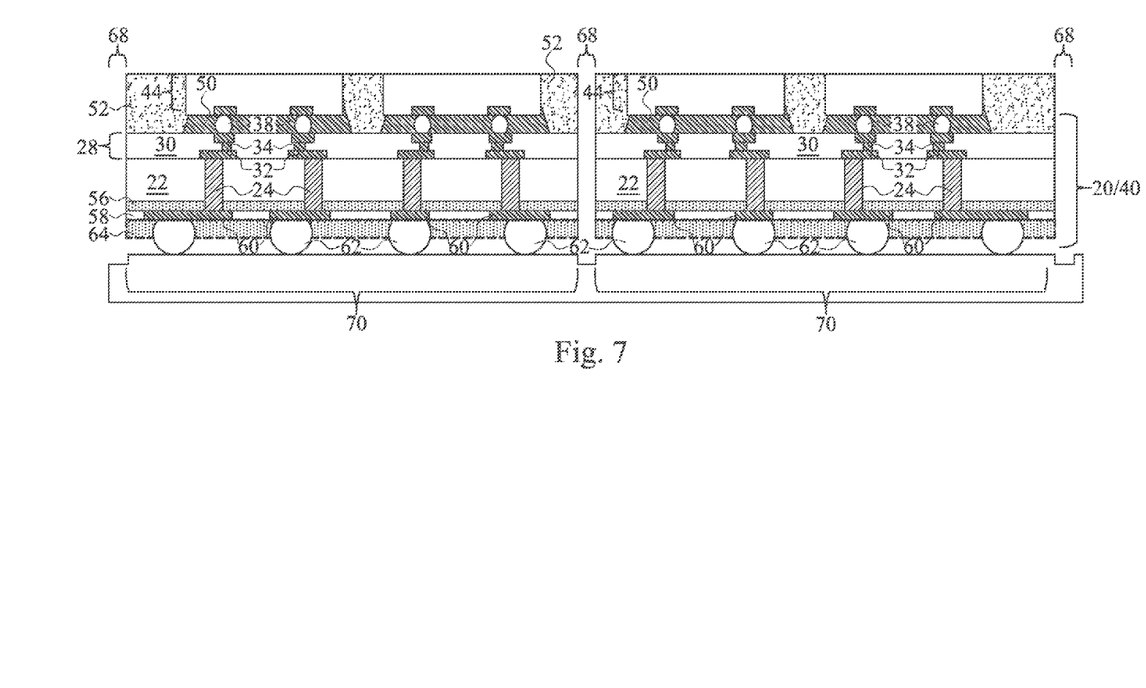

Next, referring to FIG. 7, a dicing step is performed to saw the package in FIG. 6A into a plurality of packages 70, wherein the sawing is along scribe lines 68. Package 70 is sometimes referred to as a Chip-on-Wafer (CoW) package since it is formed by bonding chips on an interposer wafer. CoW package 70 includes interposer 40 and device die 44. Since molding material 52 is sawed along with interposer wafer 20, the edges of molding material 52 are aligned to the respective edges of interposer 40.

Figure 8:
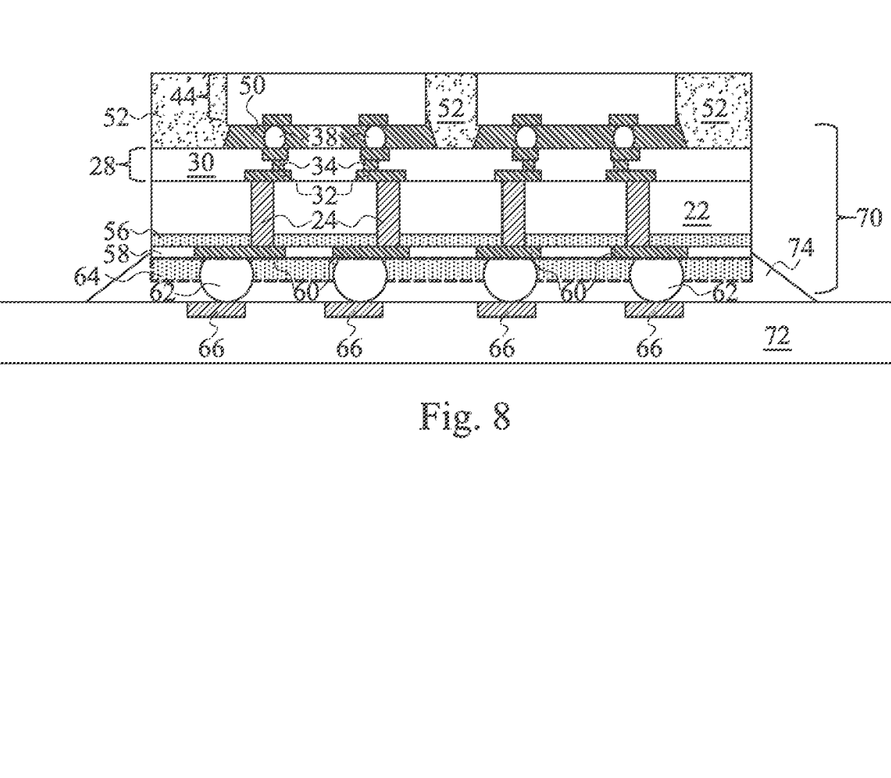

FIG. 8 illustrates the bonding of CoW package 70 to Printed Circuit Board (PCB) 72. Solder balls 62 bond CoW package 70 to PCB 72 directly, wherein no package substrate exists between CoW package 70 and PCB 72. Solder balls 62 are thus in physical contact with the metal features such as the bond pads of PCB 72. In accordance with some embodiments, Underfill 74 is dispensed into the space between CoW package 70 and PCB 72. Underfill 74 is cured after dispensing.

The embodiments of the present disclosure have some advantageous features. By bonding the CoW package directly to PCB, rather than through another package substrate between the CoW package and the PCB, the manufacturing cost is reduced. Adopting the manufacturing process of device dies to form the interconnect structure for the interposer wafer makes the formation of very small metal lines possible. The re-routability of the CoW package is thus improved. Accordingly, package substrate is no longer needed.

In accordance with embodiments, a package structure includes an interposer, a die over and bonded to the interposer, and a PCB underlying and bonded to the interposer.

In accordance with other embodiments, a package structure includes an interposer. The interposer is free from transistors therein, and includes a semiconductor substrate, an interconnect structure over the semiconductor substrate, through-vias in the silicon substrate, and redistribution lines on a backside of the silicon substrate. The interconnect structure and the redistribution lines are electrically coupled through the through-vias. The package structure further includes a device die over and bonded to the interposer, and a PCB underlying and electrically coupled to the interposer, wherein no package substrate is bonded between the interposer and the PCB.

In accordance with yet other embodiments, a method includes bonding a device die onto a front side of an interposer wafer, molding the interposer wafer with a first molding material, and performing a backside grinding on a backside of a substrate of the interposer wafer. Through-vias in the substrate are exposed after the backside grinding. The method further includes attaching solder balls to electrically couple to the through-vias, and performing a die-sawing on the molding material and the interposer wafer to form a package. A portion of the interposer wafer sawed into an interposer in the package. The package is bonded directly onto a PCB.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   bonding a die to an interposer, wherein the interposer is free from active devices, and the interposer comprises:
     a silicon substrate;
     an interconnect structure on a front side of the silicon substrate; and
     through-vias in the silicon substrate;
   encapsulating the die in a first encapsulating material;
   forming solder regions electrically coupling to the through-vias; and
   encapsulating portions of the solder regions in a second encapsulating material, wherein the second encapsulating material is applied as a flowable state, and an entirety of the first encapsulating material and an entirety of the second encapsulating material are on opposite sides of the silicon substrate; and
   curing the second encapsulating material into a solid state.

2. The method of claim 1, wherein no portion of the first encapsulating material is at a same level as the silicon substrate.

3. The method of claim 1 further comprising sawing through the interposer, the first encapsulating material, and the second encapsulating material.

4. The method of claim 1 further comprising:
   bonding the interposer to a Printed Circuit Board (PCB); and
   dispensing an underfill between the interposer and the PCB.

5. The method of claim 4, wherein the underfill has a top surface in contact with a bottom surface of the second encapsulating material, and a bottom surface in contact with the PCB.

6. The method of claim 4, wherein the interposer is directly bonded to the PCB, and no package substrate is bonded between the interposer and the PCB.

7. The method of claim 1, wherein when the interposer is sawed, the silicon substrate is sawed through.

8. The method of claim 1 further comprising:
   performing a grinding on the interposer to expose the through-vias;
   recessing a back side of the silicon substrate to allow end portions of the through-vias to extend beyond the silicon substrate; and
   forming a dielectric layer to embed the end portions of the through-vias.

9. A method comprising:
   bonding a device die onto a front side of an interposer wafer;
   encapsulating the interposer wafer with a first encapsulating material;
   performing a backside grinding on a backside of a substrate of the interposer wafer, wherein through-vias in the substrate are exposed after the backside grinding;
   attaching solder regions to electrically couple to the through-vias;
   performing a die-sawing on the first encapsulating material and the interposer wafer to form a package, wherein a portion of the interposer wafer is sawed into an interposer in the package; and
   bonding the package directly onto a Printed Circuit Board (PCB).

10. The method of claim 9, wherein the package is bonded onto the PCB through solder regions, with the solder regions in physical contact with the interposer and the PCB.

11. The method of claim 9 further comprising encapsulating a first portion of each of the solder regions in a second encapsulating material, with each of the solder regions further comprising a second portion outside of the second encapsulating material.

12. The method of claim 11, wherein the first encapsulating material and the second encapsulating material are on opposite sides of the interposer wafer.

13. The method of claim 9, wherein the interposer wafer does not include active devices therein, and wherein no package substrate is bonded between the package and the PCB.

14. The method of claim 9 further comprising:
   bonding a plurality of device dies to the interposer wafer, wherein after the die-sawing, the device dies and the interposer wafer are sawed into a plurality of packages.

15. The method of claim 9 further comprising, before attaching the solder regions, forming redistribution lines electrically coupling to the through-vias.

16. The method of claim 9 further comprising:
   after the backside grinding, recessing the substrate to allow end portions of the through-vias to extend beyond the substrate; and
   forming a dielectric layer to embed the end portions of the through-vias, wherein the dielectric layer is on the backside of the substrate.

17. A method comprising:
bonding a plurality of device dies onto an interposer wafer;
encapsulating the plurality of device dies in a first encapsulating material;
attaching a carrier to the plurality of device dies and the first encapsulating material;
grinding a substrate of the interposer wafer to reveal through-vias in the interposer wafer;
etching the substrate to allow end portions of the through-vias to protrude out of the substrate;
forming a dielectric layer, with the end portions of the through-vias being in the dielectric layer;
forming solder regions to electrically connect to the end portions of the through-vias;
sawing the first encapsulating material and the interposer wafer to form a package; and
bonding the package directly to a Printed Circuit Board (PCB).

18. The method of claim 17 further comprising, after the solder regions are formed and before the sawing the first encapsulating material, de-bonding the interposer wafer and the plurality of device dies from the carrier.

19. The method of claim 17 further comprising encapsulating a portion of each of the solder regions in a second encapsulating material, wherein the second encapsulating material is sawed along with the first encapsulating material.

20. The method of claim 19 further comprising dispensing an underfill between the PCB and the package, wherein in a cross-sectional view of the package, the underfill contacts an entirety of an edge of the second encapsulating material.

* * * * *